US010332970B2

(12) United States Patent
Vellianitis et al.

(10) Patent No.: US 10,332,970 B2
(45) Date of Patent: Jun. 25, 2019

(54) METHOD FOR MANUFACTURING HORIZONTAL-GATE-ALL-AROUND DEVICES WITH DIFFERENT NUMBER OF NANOWIRES

(71) Applicant: TAIWAN SEMICONDUCTOR MANUFACTURING CO., LTD., Hsinchu (TW)

(72) Inventors: Georgios Vellianitis, Heverlee (BE); Gerben Doornbos, Leuven (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 199 days.

(21) Appl. No.: 15/194,807

(22) Filed: Jun. 28, 2016

(65) Prior Publication Data

US 2017/0373163 A1    Dec. 28, 2017

(51) Int. Cl.
H01L 29/00     (2006.01)
H01L 29/423    (2006.01)
H01L 29/66     (2006.01)
H01L 29/06     (2006.01)
H01L 29/775    (2006.01)
H01L 29/786    (2006.01)
B82Y 10/00     (2011.01)
H01L 21/8234   (2006.01)
H01L 29/10     (2006.01)

(52) U.S. Cl.
CPC ........ H01L 29/42392 (2013.01); B82Y 10/00 (2013.01); H01L 21/823412 (2013.01); H01L 29/0673 (2013.01); H01L 29/66439 (2013.01); H01L 29/66545 (2013.01); H01L 29/66742 (2013.01); H01L 29/66795 (2013.01); H01L 29/775 (2013.01); H01L 29/78684 (2013.01); H01L 29/78696 (2013.01); H01L 29/1033 (2013.01)

(58) Field of Classification Search
CPC .......... H01L 29/42392; H01L 29/0673; H01L 29/1033; H01L 29/66545; H01L 29/66795
See application file for complete search history.

(56) References Cited

U.S. PATENT DOCUMENTS

| 9,343,559 B2* | 5/2016 | Glass ................ H01L 29/66545 |
| 9,812,524 B2* | 11/2017 | Glass ................ H01L 29/66545 |
| 2013/0161756 A1* | 6/2013 | Glass ................ H01L 29/66545 257/369 |
| 2016/0260802 A1* | 9/2016 | Glass ................ H01L 29/66545 |

* cited by examiner

Primary Examiner — Mounir S Amer
Assistant Examiner — Alexander Belousov
(74) Attorney, Agent, or Firm — McClure, Qualey & Rodack, LLP

(57) ABSTRACT

A method includes the following operations: (i) receiving a FET precursor including a first fin and a second fin, each of the first fin and the second fin having nanowire channels and sacrificial layers; (ii) forming a dummy gate traversing the first and second fins, thereby defining channel regions of the first and second fins under the dummy gate; (iii) forming source/drain features from exposed portions of the first and second fins; (iv) removing the dummy gate to expose the channel regions of the first and second fins; and (v) suspending the nanowire channels of the first and second fins by removing portions of the sacrificial layers of the first and second fins.

4 Claims, 13 Drawing Sheets

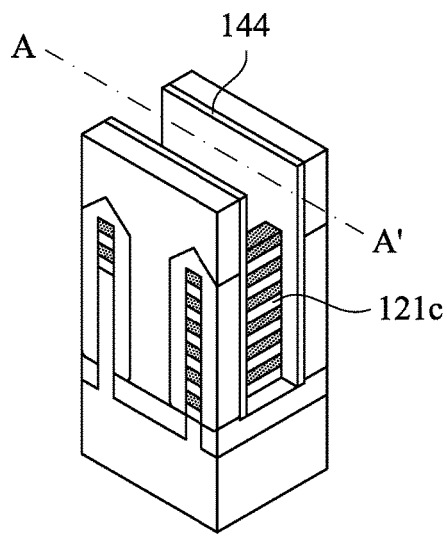 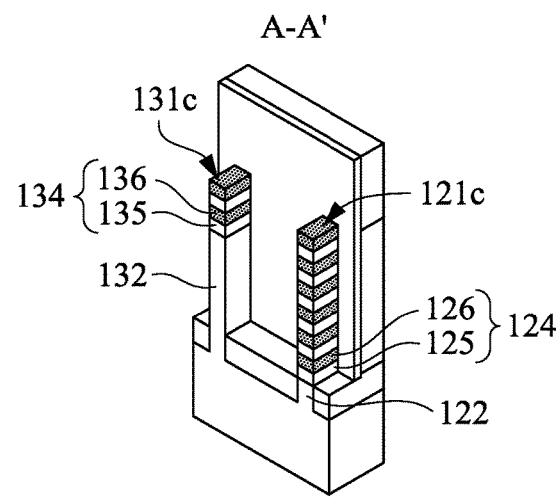
Fig. 14A  Fig. 14B
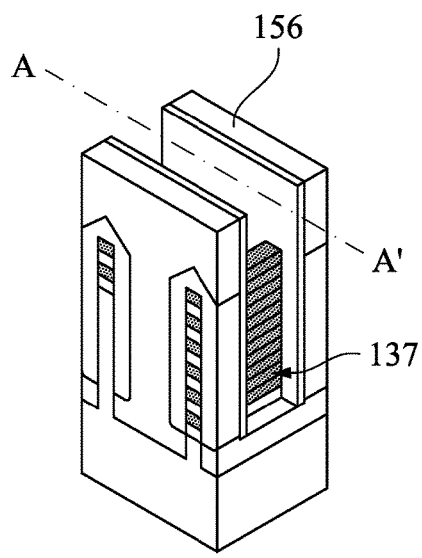 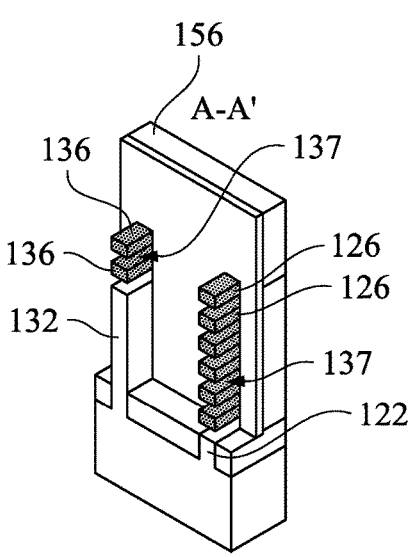
Fig. 15A  Fig. 15B

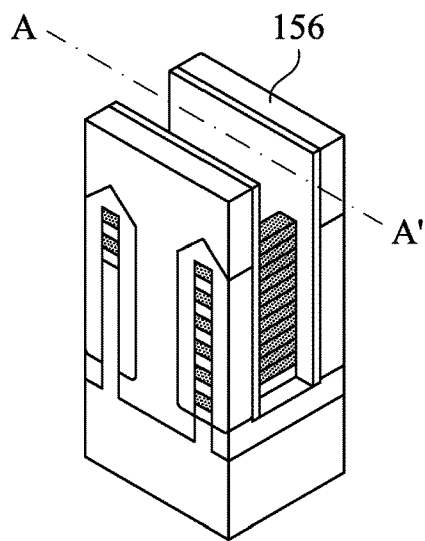 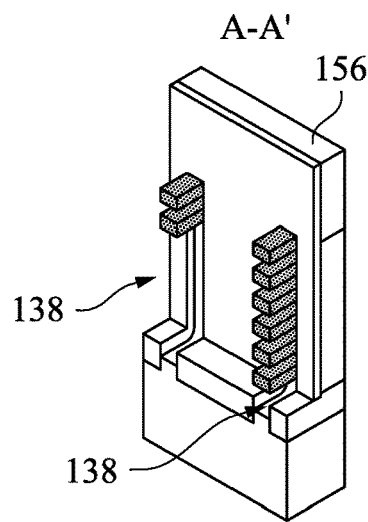
Fig. 16A Fig. 16B
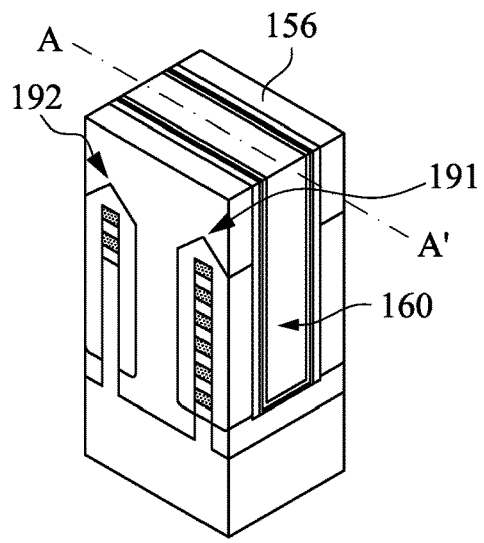 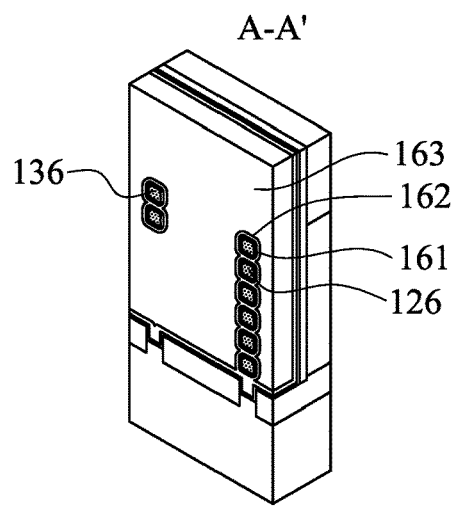
Fig. 17A Fig. 17B

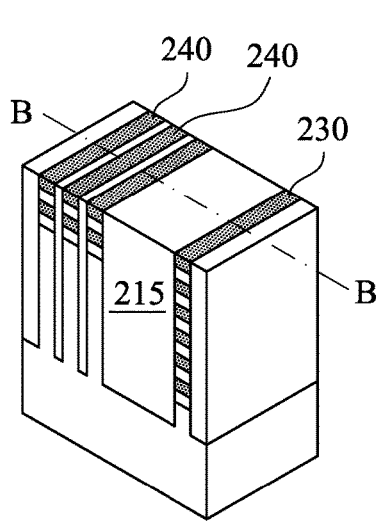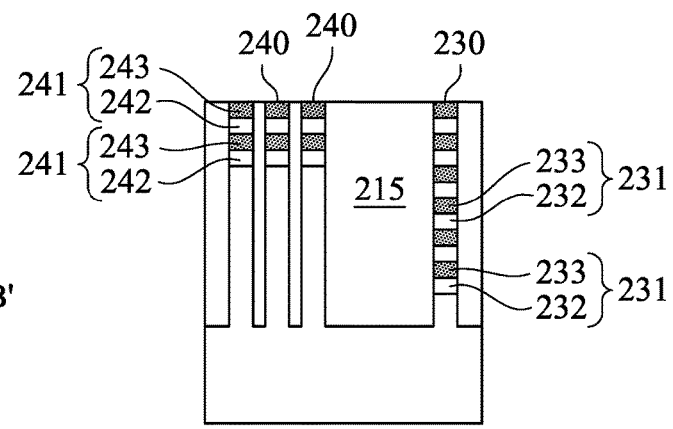
Fig. 22A    Fig. 22B
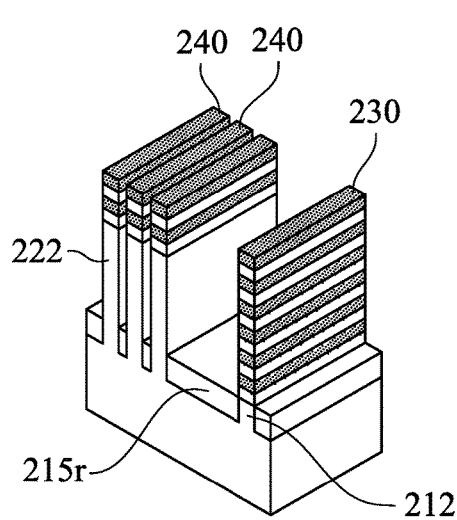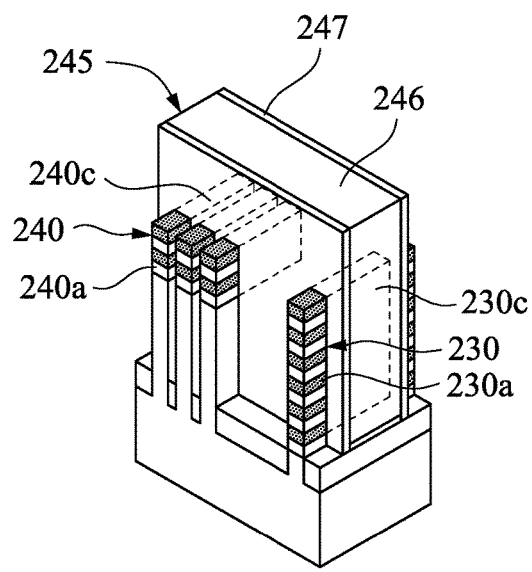
Fig. 23    Fig. 24

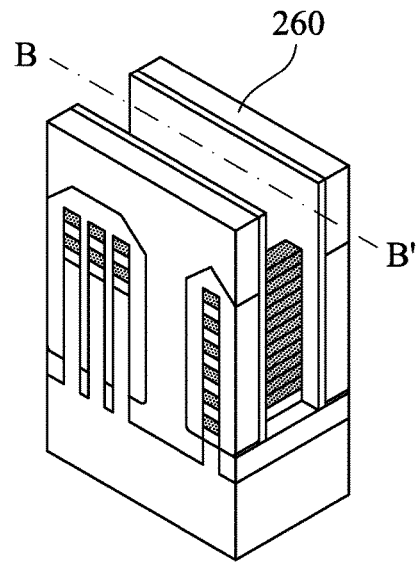 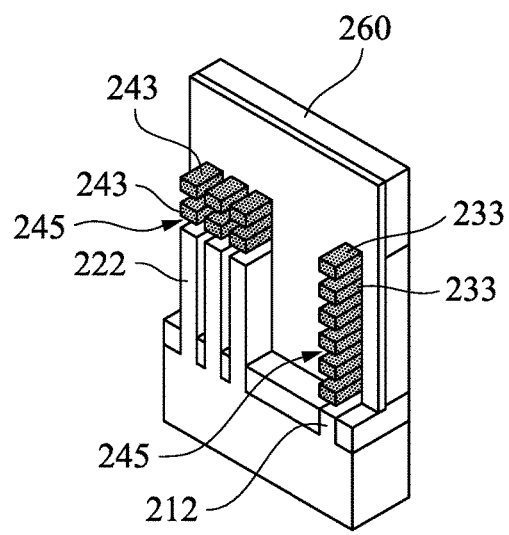
Fig. 28A  Fig. 28B
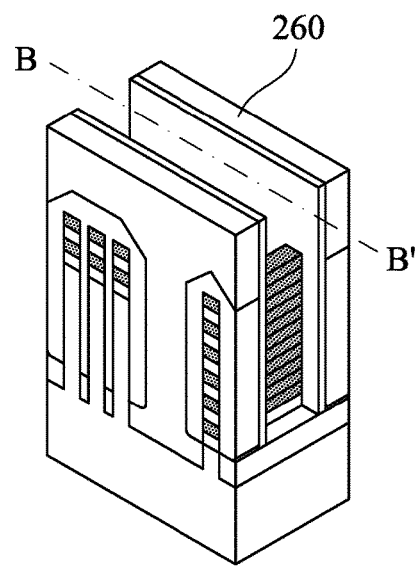 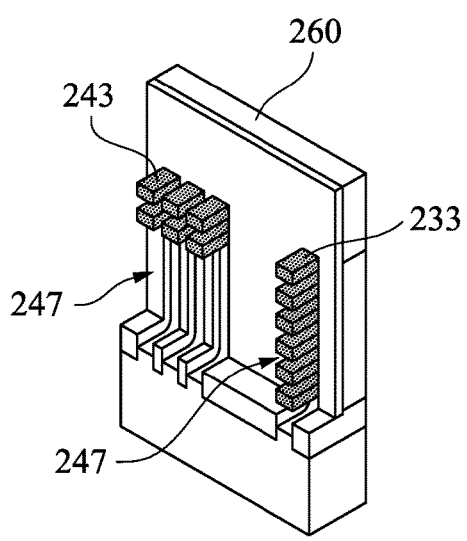
Fig. 29A  Fig. 29B

METHOD FOR MANUFACTURING HORIZONTAL-GATE-ALL-AROUND DEVICES WITH DIFFERENT NUMBER OF NANOWIRES

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three-dimensional designs, such as fin-like field effect transistors (fin-FETs). Recently, horizontal-gate-all-around (HGAA) transistors have been proposed to surpass finFETs. A typical HGAA transistor is fabricated with one or more nanowire channels horizontally suspending between source/drain regions. In addition, a gate is formed around the nanowire channels. It is beneficial to have a gate wrapping the nanowire channels that allows the gate to control the nanowire channels from all directions. However, as structures of semiconductor devices become more complex, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-17B are perspective views and cross-sectional views illustrating more detailed manufacturing methods in accordance with some embodiments of the present disclosure.

FIGS. 19-30B are perspective views and cross-sectional views illustrating more detailed manufacturing methods in accordance with some embodiments of the present disclosure.

DETAILED DESCRIPTION

Figure 1:
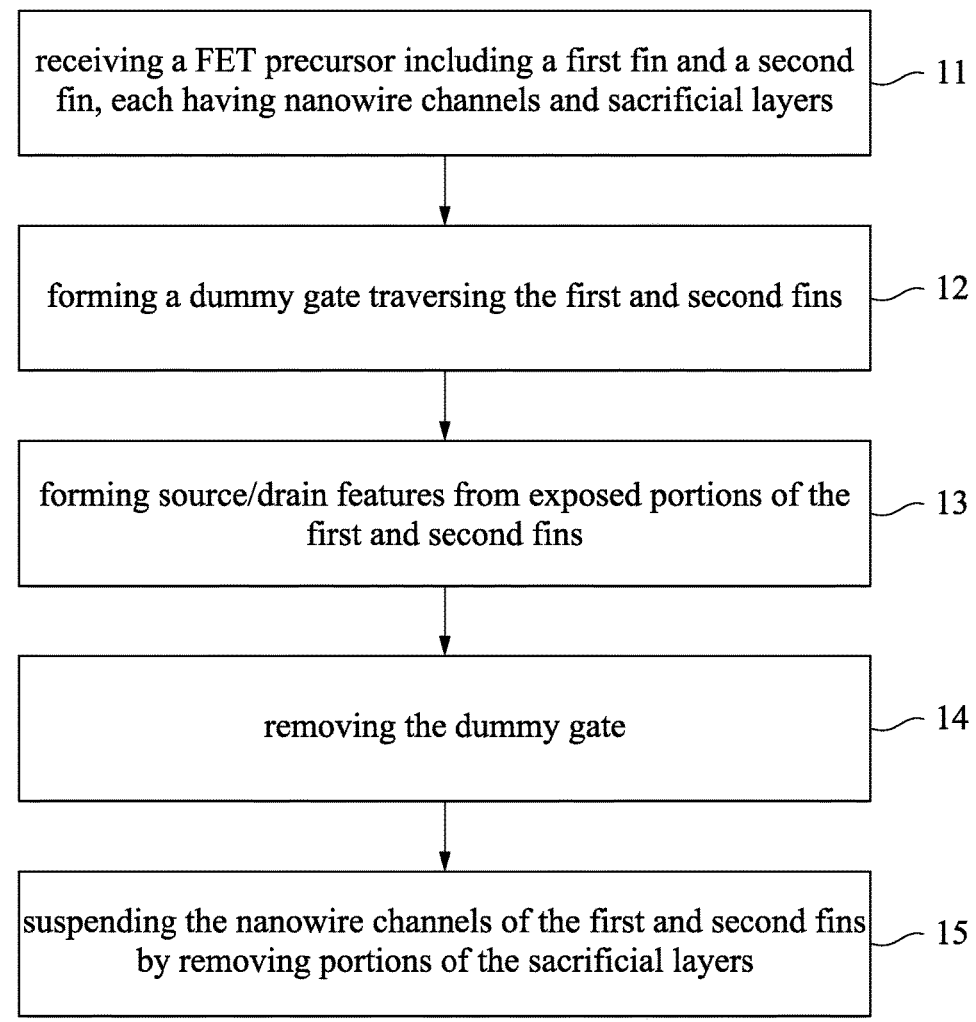
FIG. 1 is a flow chart illustrating a method of forming a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a method for manufacturing semiconductor structure including horizontal-gate-all-around (HGAA) transistors. The semiconductor industry has continually improved the speed and power of integrated circuits (ICs) by fabricating three-dimensional structures of components within the ICs. Horizontal-gate-all-around (HGAA) transistors equip with one or more nanowire channels, and the optimum number of the nanowire channels depends upon the application of the devices. For continuously improving the performance of the devices, modern ICs require semiconductor structures including HGAA transistors with different number of nanowire channels. However, conventional fabricating processes have not been entirely satisfactory in manufacturing such semiconductor structures. Accordingly, one of the aspects of the present disclosure is to provide a method for manufacturing HGAA transistors with different number of nanowire channels in the same chips.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a semiconductor structure including one or more horizontal gate-all-around transistors according to various embodiments of the present disclosure. As illustrated in FIG. 1, the method 10 includes operation 11, operation 12, operation 13, operation 14 and operation 15. FIGS. 3-30B collectively illustrate more detailed manufacturing methods as a series of perspective views and cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated operations and/or acts can be further divided into sub-operations and/or sub-acts in some implementations, while in other implementations some of the illustrated operations and/or acts can be carried out concurrently with one another.

Figure 2:
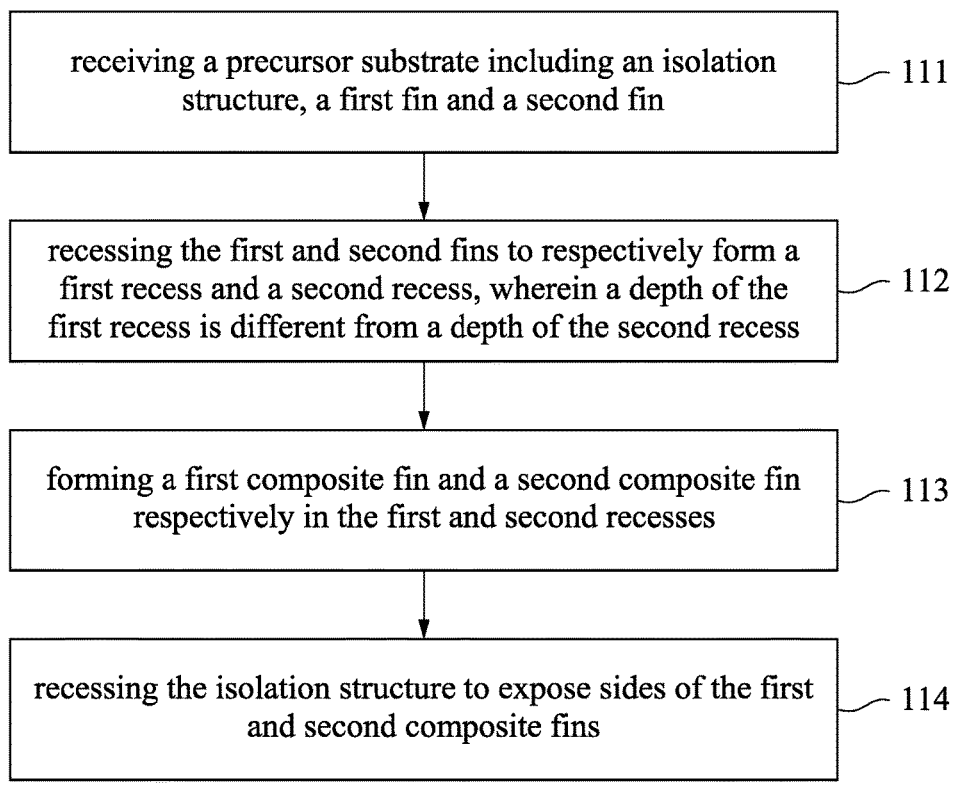
FIG. 2 a flow chart illustrating a method to implement the operation 11 according to some embodiments of the present disclosure.

Referring to FIG. 1, the method 10 begins at the operation 11 by receiving a FET precursor. There are a variety of methods or approaches to obtain the FET precursor. For examples. FIG. 2 illustrating a method 11" to form the FET precursor of the operation 11 in a flowchart format according to some embodiments of the present disclosure. As shown in FIG. 2, the method 11" includes act 111, act 112, act 113 and act 114. In addition, FIGS. 3-10 depict perspective views and cross-sectional views at various fabrication stages in the method 11" according to some embodiments of the present disclosure. It should be noted that the fabrication stages as well as the features in connection with FIGS. 3-10 are merely examples. A person skilled in the art will recognize there may be many alternatives, variations and modifications.

Figure 3:
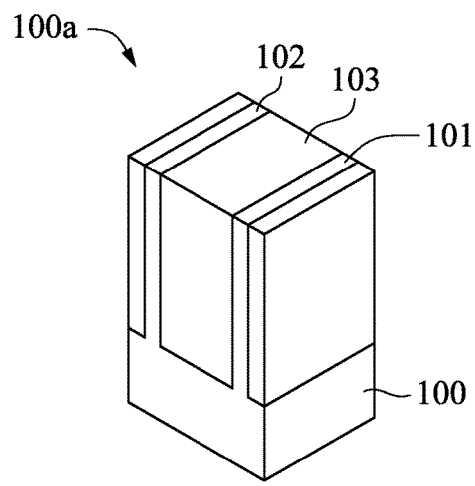

Referring to FIGS. 2 and 3, method 11" proceed to act 111 by receiving a precursor substrate 100a including an isolation structure 103, a first fin 101 and a second fin 102. The first fin 101 and the second fin 102 are spaced apart from each other, and are embedded in the isolation structure 103. It is noted that the second fin 102 may be far away from the first fin 210 although FIG. 3 depicts the second fin 102 being adjacent to the first fin 101. In examples, the first fin 101 and second fin 102 may be configured to form separate devices that may be independently controlled. In some embodiments, the precursor substrate 100a further includes a substrate 100, and the first fin 101 and the second fin 102 are fabricated from the substrate 100. In examples, the first and second fins 101, 102 include the same material as the substrate 100. Nevertheless, in yet some embodiments, the first and second fins 210, 220 may include different material from the substrate 200.

In some embodiments, the substrate 100 may be a bulk silicon substrate. In yet some embodiments, the substrate 100 include an elementary semiconductor such as for example germanium or silicon in a crystalline structure. In yet some embodiments, the substrate 100 include a compound semiconductor such as for example gallium arsenic, silicon carbide, indium phosphide, gallium phosphide or indium antimonide, or combinations thereof. In yet some embodiments, the substrate may include an alloy semiconductor such as silicon germanium, silicon germanium carbide, gallium arsenic phosphide, and gallium indium phosphide.

The precursor substrate 100a may be formed by the steps described below according to some embodiments of the present disclosure. First, the substrate 100 may be etched to form a plurality of trenches by lithography and etch processes. The trenches define the region of the isolation structure 103. Illustrative examples of the trench etching technique include a high-density plasma etch that utilizes either inductive, helicon, or electron cyclotron resonance (ECR) plasmas, or other suitable etch techniques. The trenches are then filled by a dielectric material. Illustrative trench filling techniques include chemical vapor deposition (CVD), high density plasma (HDP) CVD, sub-atmospheric pressure CVD (SACVD), and spin-on dielectric (SOD). Thereafter, the excess dielectric material may be removed using a chemical mechanical polishing (CMP) process or any suitable process so to form the first fin 101, the second fin 102, and the isolation structure 103.

Referring to FIG. 2, the method 11" proceeds to the act 112 by recessing the first and second fins to respectively form a first recess and a second recess, wherein a depth of the first recess is different from a depth of the second recess. FIGS. 4-7 are diagrams showing detailed steps to implement act 112 according to some embodiments of the present disclosure.

Figure 4:
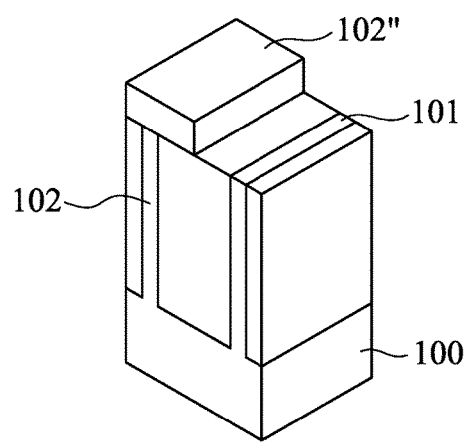
Figure 5:
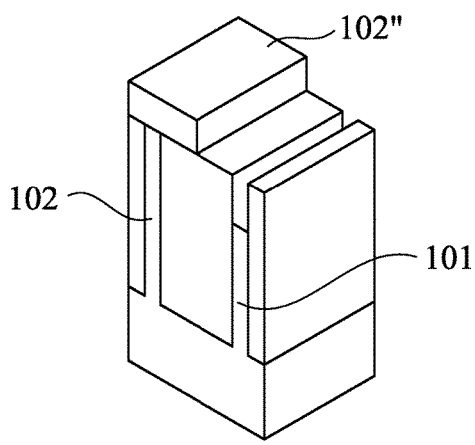
Figure 6:
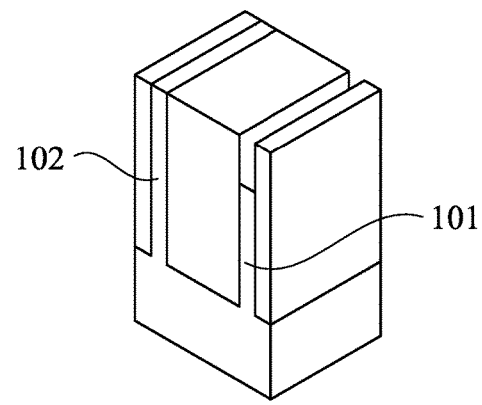
Figure 7:
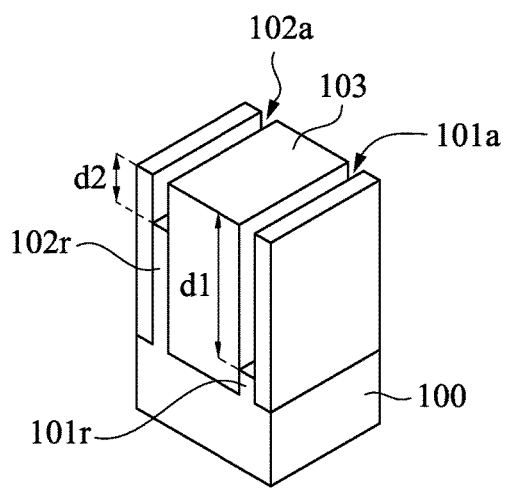

As illustrated in FIG. 4, a mask such as hard mask 102" is formed covering the second fin 102 of the precursor substrate 100a while the first fin is exposed out of the hard mask 102". Thereafter, as shown in FIG. 5, an etching process is performed to etch the first fin 101, and a recess therefore is formed above the remained first fin 101. The hard mask 102" is then removed, as shown in FIG. 6. Referring to FIG. 7, another etching process is carried out to concurrently etch the remained first fin 101 and the second fin 102 after the hard mask 102" is removed, thereby forming a first recess 101a and a second recess 102a. The first fin 101 and the second fin 102 are not completely removed, and the remained first and second fins 101r, 102r constitute the bottoms of the first and second recesses 101a, 102a. The depth d1 of the first recess 101a is different from the depth d2 of the second recess 102a. For example, the depth d1 is greater than the depth d2. One skilled in the art would appreciate that a variety of approaches may be used to form the first and second recesses 101a, 102a with different depths, and the present disclosure therefore is not limited on the steps and/or features illustrated in FIGS. 4-7.

Figure 8:
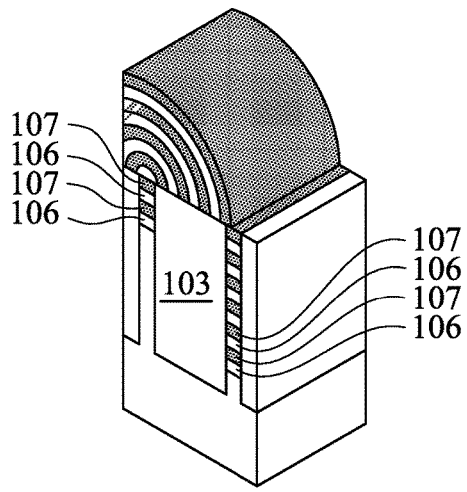

Referring to FIG. 2, the method 11" proceeds to the act 113 by forming a first composite fin and a second composite fin respectively in the first and second recesses. FIGS. 8-9 are diagrams showing detailed steps to implement act 113 according to some embodiments of the present disclosure.

As illustrated in FIG. 8, a plurality of sacrificial layer layers 106 and a plurality of channel layers 107 are alternately epitaxially grown on the remained first and second fins 101r, 102r in the first and second recesses. In some embodiments, the sacrificial layer layers 106 include material of $Si_xGe_{(1-x)}$ and the channel layers 107 includes material of $Si_yGe_{(1-y)}$, in which "x" and "y" represent Si molar ratios and are numbers between 0 and 1. Further, "x" is different from "y". In some examples, the difference between "x" and "y" is greater than approximately 0.2, specifically greater than about 0.3, more specifically greater than about 0.4 or about 0.5. For example, the Si molar ratio y of the channel layers 107 may be about 0.2 to about 0.5, whereas the Si molar ratio x of the sacrificial layer layers 106 may be about 0.3 to about 0.6, or about 0.4 to about 0.7, or about 0.5 to about 0.8. In yet some examples, the channel layers 107 may include Ge-rich SiGe material, whereas the sacrificial layers 106 may include Si-rich SiGe material. In yet some examples, the formation of the sacrificial layer layers 106 includes epitaxially growing a silicon layer which does not include germanium. The difference in the Si molar ratio between the sacrificial layer layers 106 and the channel layers 107 allows the material of the sacrificial layer to be removed in the subsequent process while the material of the channel layers 107 is remained.

The sacrificial layers 106 and the channel layers 107 fill the first and second recesses. Further, the layers 106, 107 have excess portions over the isolation structure 103, which are grown from the material in second recess 102a, as the depth d2 of the second recess 102a is less than the depth d1 of the first recess 101a (labeled in FIG. 7).

Figure 9A:
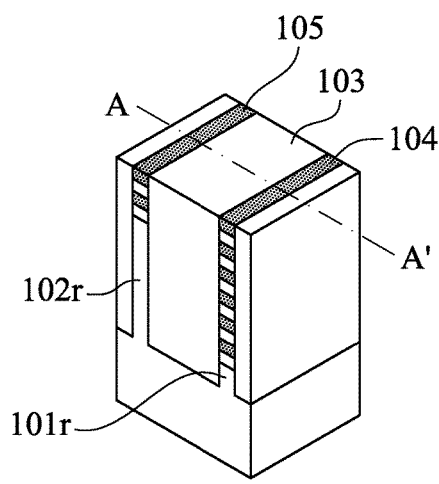

As illustrated in FIG. 9A, the excess portions of the layers 106, 107 on the isolation structure 103 may be removed by a chemical-mechanical polishing (CMP) process. The CMP process may stop on a top surface of the isolation structure 103. The portions of the layers 106, 107 filled in the first and second recesses 101a, 102a constitute a first composite fin 104 and a second composite fin 105 respectively in the first and second recesses 101a, 102a.

Figure 9B:
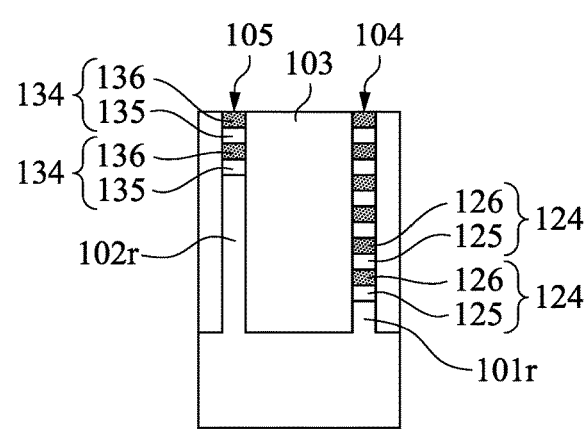

FIG. 9B is a cross-sectional view along the line A-A' of FIG. 9A. Referring to FIGS. 8 and 9B, the remained portions of the sacrificial layers 106 form sacrificial layers 125, 135 in the first and second recesses. Further, the remained portions of the channel layers 107 form nanowire channels 126, 136 in the first and second recesses. In other words, the first composite fin 104 includes a first number of first composite layers 124, each of the first composite layers 124 including a sacrificial layer 125 and a nanowire channel 126 stacked on the sacrificial layer 125. Similarly, the second composite fin 105 includes a second number of second composite layers 134, each of the second composite layers 134 including a sacrificial layer 135 and a nanowire channel 136 stacked on the sacrificial layer 135. It is noted that the first number is greater than the second number as the depth of the first recess is greater than the depth of the second recess. For examples, the first number may be six while the second number may be two. However, the first number and the second number may be any number, depending on the requirement.

In addition, the first composite fin 104 and the second composite fin 105 are respectively stacked on the remained first fin 101r and the remained second fin 102r. In examples, one of the sacrificial layers 125 of the first composite fins 104 is in direct contact with the remained first fin 101r. Further, one of the sacrificial layers 135 of the second composite fin 105 is in direct contact with the remained second fin 102r.

Figure 10:
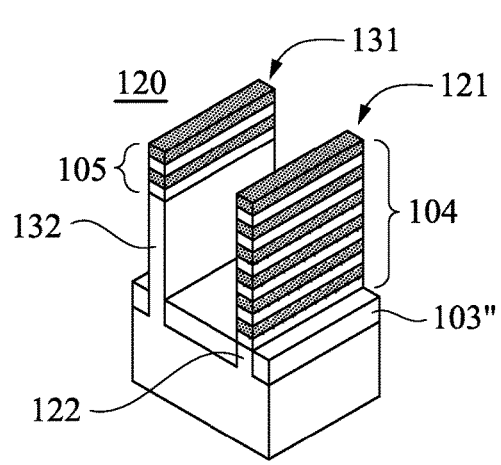

Referring to FIGS. 2 and 10, the method 11" proceeds to the act 114 by recessing the isolation structure 103 to expose sides of the first and second composite fins 104, 105, thereby obtaining a FET precursor 120. The act 114 may include an etching process that selectively etches the isolation structure 103. Illustrative examples of the etching process include a high-density plasma etch that utilizes either inductive, helicon, or electron cyclotron resonance (ECR) plasmas, or other suitable etch techniques.

The FET precursor 120 may be used in the operation 11 of the method 10 in FIG. 1. In various embodiments, the FET precursor 120 may includes a first fin 121 and a second fin 131. Referring to FIGS. 9B and 10, the first fin 121 includes a first base-fin 122 (e.g., the remained first fin 101r) and a first number of the first composite layers 124 on the first base-fin 122. The second fin 131 includes a second base-fin 132 (e.g., the remained second fin 102r) and a second number of second composite layers 134 on the second base-fin 132. Significantly, the first number is different from the second number. Additionally, each of the first composite layers 124 includes a sacrificial layer 125 and a nanowire channel 126 stacked thereon, and each of second composite layers 134 includes a sacrificial layer 135 and a nanowire channel 136 stacked thereon. Furthermore, a height of the first base-fin 122 is different from a height of the second base-fin 132. For example, the height of the first base-fin 122 may be less than the height of the second base-fin 132. In some embodiments, the FET precursor 120 may further includes an isolation structure 103" such as a shallow trench isolation (STI) on the sides of the first and second base-fins 122, 132.

Figure 11:
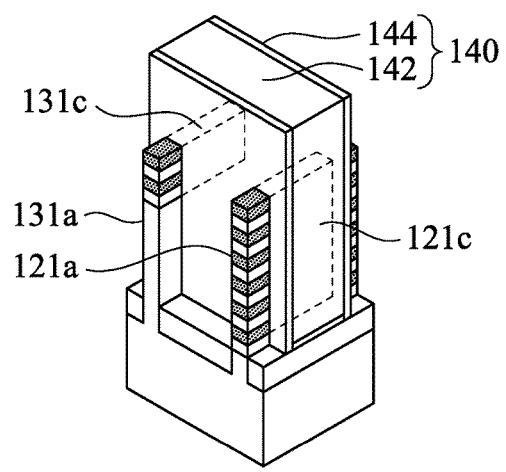

Referring back to FIG. 1, the method 10 proceeds to the operation 12 by forming a dummy gate traversing the first and second fins. As illustrated in FIG. 11, a dummy gate 140 is formed traversing the first and second fins 121, 131. The dummy gate 140 defines channel regions 121c, 131c of the first and second fins 121, 131 under the dummy gate 140. In some embodiments, the dummy gate 140 crosses over the first and second composite fins 104, 105 (labeled in FIG. 10). In some embodiments, the dummy gate 140 includes a polycrystalline silicon gate 142 and a spacer 144 on the sides of the polycrystalline silicon gate 142. In addition, the first and second fins 121, 131 have exposed portions 121a, 131a that are exposed out of the dummy gate 140.

Figure 12:
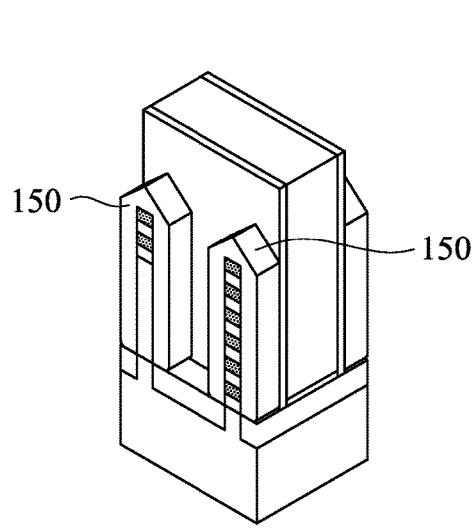

Referring to FIG. 1, the method 10 proceeds to the operation 13 by forming source/drain features from exposed portions of the first and second fins. As illustrated in FIG. 12, source/drain features 150 may be formed from the exposed portions 121a, 131a (labeled in FIG. 11) of the first and second fins 121, 131. In examples, the source/drain features 150 are epitaxially grown from the exposed portions 121a, 131a of the first and second fins 121, 131. In some embodiments, the epitaxy process may use molecular beam epitaxy, vapor-phase epitaxy (VPE), ultra-high vacuum CVD (UHV-CVD)) or other suitable techniques. The epitaxy process may use precursors which interact with the composition material of the exposed portions 121a, 131a of the first and second fins 121, 131. In some examples, the precursors interact with silicon of the exposed portions 121a, 131a of the first and second fins 121, 131. In yet some examples, the precursors interact with silicon germanium (SiGe) of the exposed portions 121a, 131a of the first and second fins 121, 131.

Figure 13:
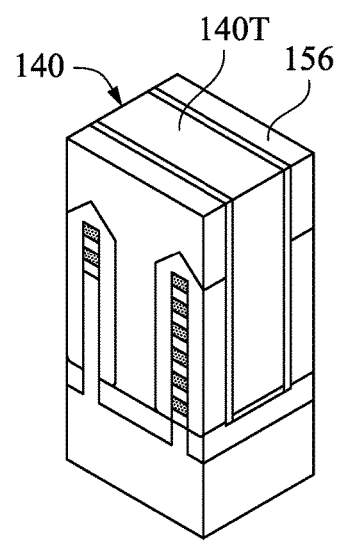

Referring to FIG. 13, the method 10 may optionally include an operation of forming a dielectric layer 156 covering the source/drain features 150. For example, a layer of dielectric material may be deposited to cover both the dummy gate 140 and the source/drain features 150. Thereafter, a CMP process may be performed on the dielectric material so as to remove the portion of the dielectric material over the dummy gate 140, thus forming the dielectric layer 156 and exposing a top 140T of the dummy gate 140.

Referring to FIG. 1, the method 10 proceeds to the operation 14 by removing the dummy gate. FIGS. 14A-14B illustrate the structure after the removal of the dummy gate, in which FIG. 14B shows the cross section along the line A-A' of FIG. 14A. After removing the dummy gate, the channel regions 121c, 131c of the first and second fins are exposed. The dummy gate may be partially or entirely removed as long as the channel regions 121c, 131c are exposed. For example, while the dummy gate includes the polycrystalline silicon gate and the spacer 144, the operation 14 removes the polycrystalline silicon gate 142, but leaves the spacer 144. The dummy gate may be removed by any suitable etching process such as a wet etching process, a dry etching process such as a high-density plasma etch process, or other suitable techniques.

Referring to FIG. 1, the method 10 proceeds to the operation 15 by suspending the nanowire channels of the first and second fins by removing portions of the sacrificial layers. FIG. 15A-15B show the structure after the removal of the portions of the sacrificial layers, in which FIG. 15B shows the cross section along the line A-A' of FIG. 15A. The portions of the sacrificial layers 125, 135 (labeled in FIG. 14B) in the channel regions 121c, 131c of the first and second fins are removed. In FIG. 15B, void region 137 indicates where the portions of the sacrificial layers are removed. After removing the portions of the sacrificial layers, the nanowire channels 126, 136 are suspended between a pair of source/drain features.

After the operation 15, the method 10 may include other operations or acts according to some embodiments of the present disclosure. For example, the method 10 may optionally include an operation of removing the first base-fin and the second base-fin. FIGS. 16A-16B illustrate the structure after the removal of the first base-fin 122 and the second base-fin 132 (labeled in FIG. 15B), in which FIG. 16B shows the cross-section view along the line A-A' of FIG. 16A. In FIG. 16B, void region 138 indicate where the first base-fin 122 and the second base-fin 132 are removed. The first base-fin 122 and the second base-fin 132 may be removed by wet etching process, dry etching process or other suitable processes.

Referring to FIGS. 17A and 17B, the method 10 may further include an operation of forming a metal gate 160 wrapping the nanowire channels 126, 136. For example, an interfacial layer 161, a high-k dielectric layer 162, and a metal gate material 163 are deposited, and than a CMP process is carried out to remove the materials over the dielectric layer 156. Although FIGS. 17A and 17B depict that the nanowire channels 126, 136 are wrapped or surrounded by the metal gate 160, it is noted that the nanowire channels 126 and the nanowire channels 136 may be configured to form separate devices that may be independently controlled, and therefore the nanowire channels 126 and the nanowire channels 136 may be wrapped by discrete metal gates.

Accordingly, a semiconductor structure including two HGAA transistors with different number of nanowire channels may be obtained according to various embodiments of the present disclosure. For example, as shown in FIGS. 17A and 17B, a HGAA transistor 191 with six nanowire channels 126 and a HGAA transistor 192 with two nanowire channels 136 may be concurrently fabricated.

Figure 18:
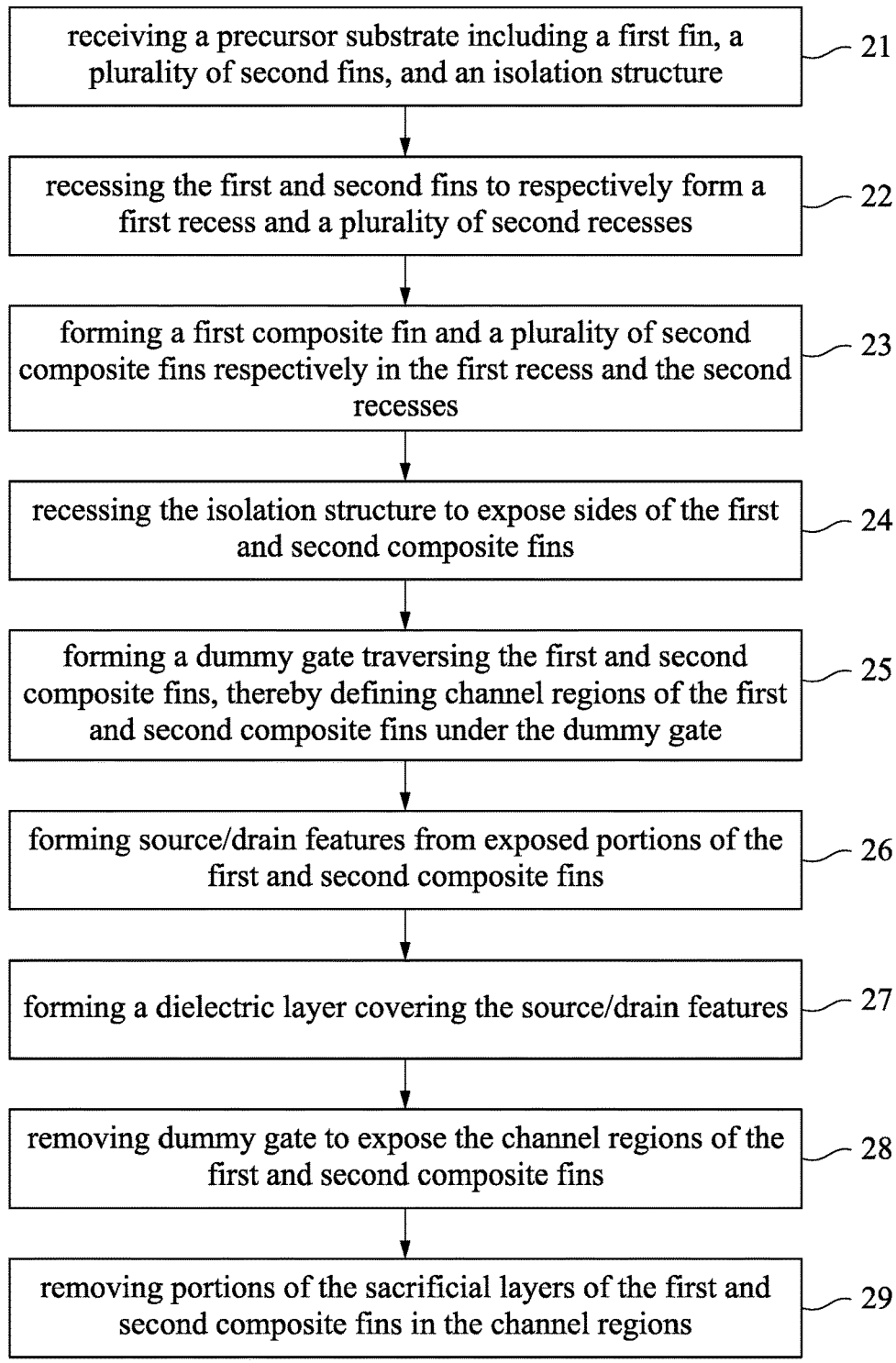
FIG. 18 is a flow chart illustrating a method of forming a semiconductor structure according to some embodiments of the present disclosure.

FIG. 18 is a flow chart illustrating a method 20 of forming a semiconductor structure including one or more HGAA devices according to yet some embodiments of the present disclosure. As illustrated in FIG. 18, the method 20 including operations 21-29. FIGS. 19-30B are perspective views and cross-sectional views illustrating more detailed manufacturing methods in accordance with some embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated operations and/or acts can be further divided into sub-operations and/or sub-acts in some implementations, while in other implementations some of the illustrated operations and/or acts can be carried out concurrently with one another.

Figures 19, 20:
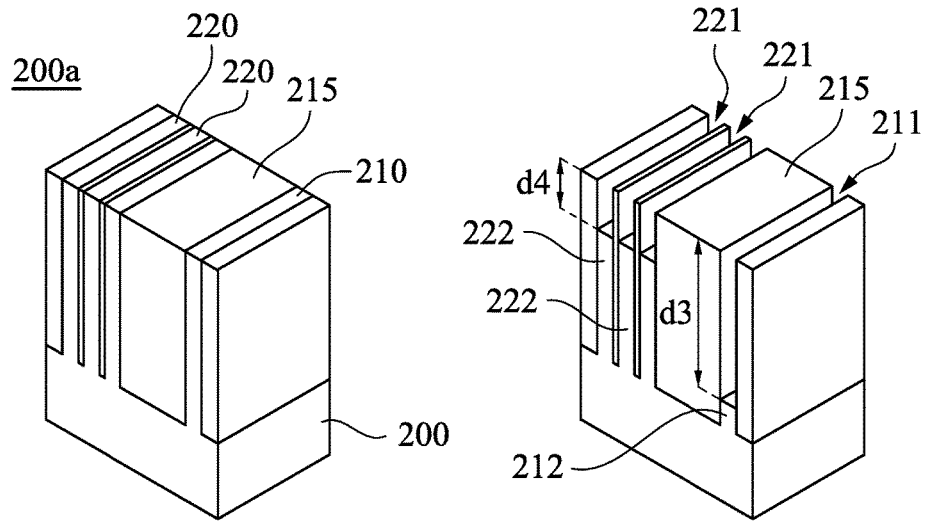

Referring to FIG. 18, the method 20 begins at the operation 21 by receiving a precursor substrate including a first fin, a plurality of second fins, and an isolation structure. As shown in FIG. 19, the received precursor substrate 200a includes a first fin 210, a plurality of second fins 220, and an isolation structure 215. The first and second fins 210, 220 are embedded in the isolation structure 215. It is noted that the collection of the second fins 220 may be far away from the first fin 210 although FIG. 19 depicts the second fins 220 being adjacent to the first fin 210. In examples, the first fin 210 and the collection of the second fins 220 may be configured to form discrete devices that may be independently controlled. In some embodiments, the first and second fins 210, 220 are fabricated from a substrate 200, and include the same material as the substrate 200. Nevertheless, in yet some embodiments, the first and second fins 210, 220 may include different material from the substrate 200. Moreover, the second fins 220 are adjacent to each other so as to form a dense pattern in a top view. The second fins 220 are collectively configured to cause a loading effect on an etching process which is subsequently performed. Specifically, the distance between adjacent ones of the second fins 220 is considerably smaller that of other fins. Furthermore, some of the second fins 220 are dummy fins for implementing the method described hereinafter, and the dummy fins may not contribute to the final electric performance of the semiconductor devices according to some embodiments of the present disclosure.

Referring to FIGS. 18 and 20, the method 20 proceeds to operation 22 by recessing the first and second fins 210, 220 to respectively form a first recess 211 and a plurality of second recesses 221. The remained first fin 212 and the remained second fins 222 respectively constitute the bottom of the first recess 211 and the second recesses 221. Furthermore, a depth d3 of the first recess 211 is greater than a depth d4 of each second recess 221. In some embodiments, the operation 22 may include an etching process that concurrently etches the first and second fins 210, 220. The etching process may be a wet etching process, a dry etching process, or other suitable techniques that have patent-dependent etching characteristics. In particular, the patent-dependent etching refers to an etching process in which an etching rate of a material layer desirably to be etched is changed or varied upon the pattern of the material layer. Since the second fins 220 collectively cause the loading effect on the etching process, the etching rate of the second fins 220 is less than that of the first fin 210. As a result, the depth d4 of each second recess 221 is less than that of the first recess 211.

Figure 21:
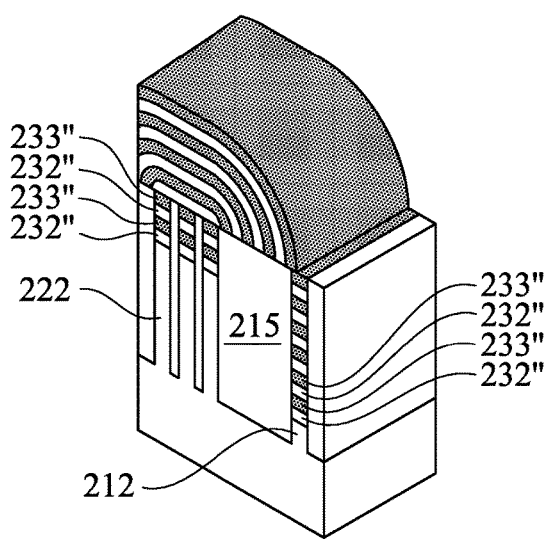

Referring to FIG. 18, the method 20 proceeds to operation 23 by forming a first composite fin and a plurality of second composite fins respectively in the first recess and the second recesses. FIGS. 21-22B are diagrams showing detailed steps to implement operation 23 according to some embodiments of the present disclosure.

As illustrated in FIG. 21, a plurality of sacrificial layer layers 232" and a plurality of channel layers 233" are alternately epitaxially grown on the remained first and second fins 212, 222. The materials of the sacrificial layer layers 232" and the channel layers 233" may be the same as the sacrificial layer layers 106 and the channel layers 107 described hereinbefore.

The sacrificial layers 232" and the channel layers 233" fill the first and second recesses 211, 221 (labeled in FIG. 20). Further, the layers 232", 233" have excess portions over the isolation structure 215. The excess portions 215 over the isolation structure are grown from the material in second recesses 221 as the depth of each of the second recess is less than the depth of the first recess 211.

Referring to FIG. 22A, the excess portions of the layers 232", 233" on the isolation structure may be removed by a chemical-mechanical polishing (CMP) process. The CMP process may stop on a top surface of the isolation structure 103. The portions of the layers 232", 233" filled in the first and second recesses 101a, 102a form a first composite fin 230 and a plurality of second composite fins 240 respectively in the first and second recesses.

FIG. 22B is a cross-sectional view along the line B-B' of FIG. 22A. Referring to FIGS. 21 and 22B, the portions of the sacrificial layers 232" in the first and second recesses form sacrificial layers 232, 242. Further, the portions of the channel layers 233" in the first and second recesses form nanowire channels 233, 243. In other words, the first composite fin 230 includes a first number of first composite layers 231, each first composite layer 231 including a sacrificial layer 232 and a nanowire channel 233 stacked on the sacrificial layer 232. Similarly, the second composite fins 240 each includes a second number of second composite layers 241, each second composite layer 241 including a sacrificial layer 242 and a nanowire channel 243 stacked on the sacrificial layer 242. It is noted that the first number is greater than the second number as the depth of the first recess is greater than the depth of the second recess.

Referring to FIGS. 18 and 23, the method 20 proceeds to the operation 24 by recessing the isolation structure 215 to expose sides of the first and second composite fins 230, 240. The operation 24 may include an etching process that selectively etches the isolation structure 215. Illustrative examples of the etching process include a high-density plasma etch that utilizes either inductive, helicon, or electron cyclotron resonance (ECR) plasmas, or other suitable etch techniques. The isolation structure 215 may be partially etched, thus leaving an isolation structure 215r on the sides of the remained first and second fins 212, 222.

Referring to FIG. 18, the method 20 proceeds to the operation 25 by forming a dummy gate traversing the first and second composite fins, thereby defining channel regions of the first and second composite fins under the dummy gate. As illustrated in FIG. 24, a dummy gate 245 is formed crossing over the first and second composite fins 230, 240. The dummy gate 245 defines channel regions 230c, 240c of the first and second composite fins 230, 240 under the dummy gate 245. In some embodiments, the dummy gate 245 includes a polycrystalline silicon gate 246 and a spacer 247 on the sides of the polycrystalline silicon gate 246. In addition, the first and second composite fins 230, 240 have exposed portions 230a, 240a that are exposed out of the dummy gate 245.

Figure 25:
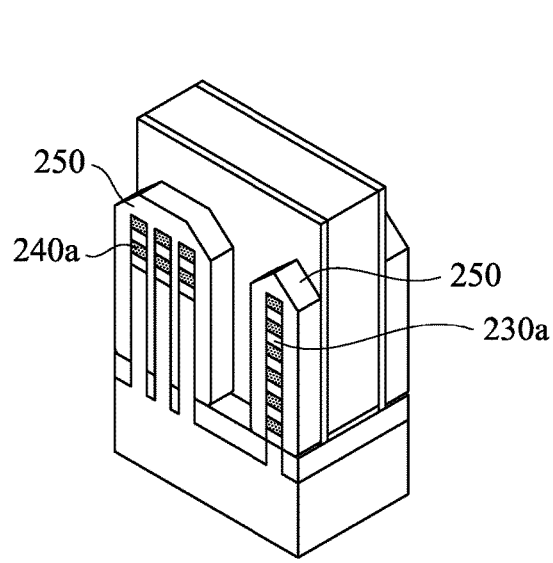

Referring to FIGS. 18 and 25, the method 20 proceeds to the operation 26 by forming source/drain features 250 from the exposed portions 230a, 240a of the first and second composite fins 230, 240. In examples, the source/drain features 250 are epitaxially grown from the exposed portions 230a, 240a of the first and second composite fins 230, 240. In some embodiments, the epitaxy process may use molecular beam epitaxy, vapor-phase epitaxy (VPE), ultra-high vacuum CVD (UHV-CVD)) or other suitable techniques.

Figure 26:
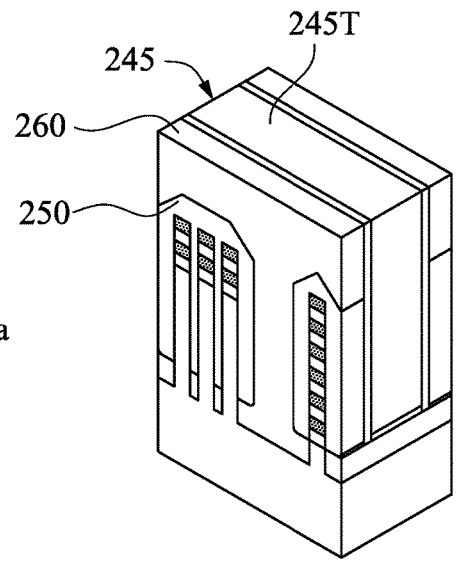

Referring to FIGS. 18 and 26, the method 20 proceeds to the operation 27 by forming a dielectric layer 260 covering the source/drain features 250. In some embodiments, a layer of dielectric material may be deposited to cover both the dummy gate 245 and the source/drain features 250. Thereafter, a CMP process may be carried out on the dielectric material so to remove the portion of the dielectric material over the dummy gate 245, thus exposing a top 245T of the dummy gate 245.

Figure 27A:
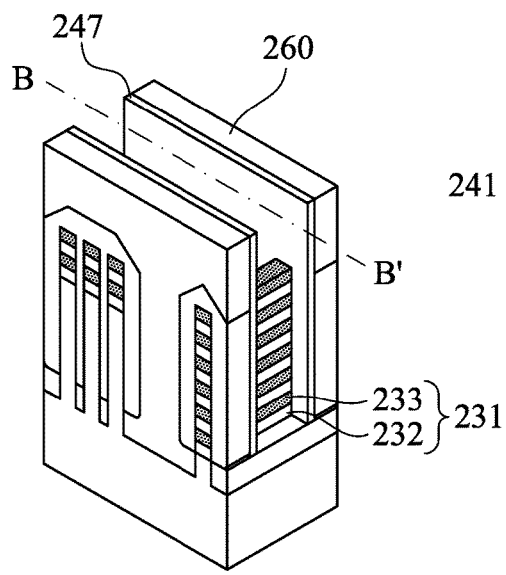
Figure 27B:
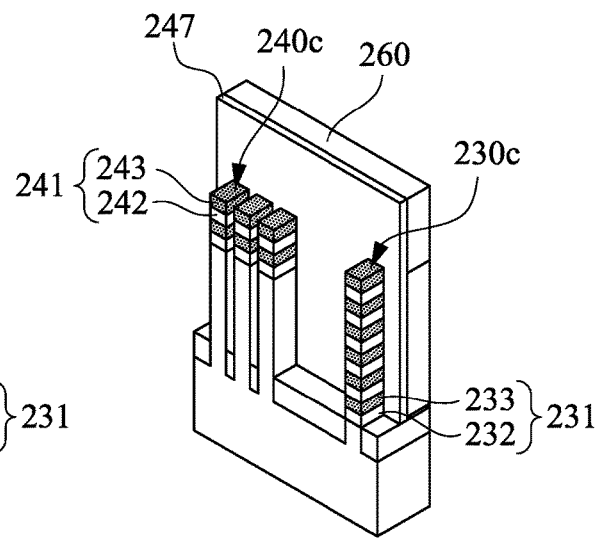

Referring to FIG. 18, the method 20 proceeds to the operation 28 by removing dummy gate to expose the channel regions of the first and second composite fins. FIGS. 27A-27B illustrates the structure after the removal of the dummy gate, in which FIG. 27B shows the cross section view along the line B-B' of FIG. 27A. After removing the dummy gate, the channel regions 230c, 240c of the first and second fins 121, 131 are exposed. The dummy gate may be partially or entirely removed as long as the channel regions 230c, 240c are exposed. For example, while the dummy gate includes the polycrystalline silicon gate 246 and the spacer 247, the operation 28 may remove the polycrystalline silicon gate 246, but leaves the spacer 247. The dummy gate may be removed by any suitable etching process such as a wet etching process, a dry etching process such as a high-density plasma etch process, or other suitable techniques.

Referring to FIG. 18, the method 20 proceeds to the operation 29 by removing portions of the sacrificial layers in the channel regions of the first and second composite fins. FIG. 28A-28B show the structure after the removal of the portions of the sacrificial layers, in which FIG. 28B shows the cross section along the line B-B' of FIG. 28A. The portions of the sacrificial layers 232, 242 in the channel regions 230c, 240c (labeled in FIG. 27B) of the first and second composite fins are removed, thus leaving void regions 245 in the place of the removed portions of the sacrificial layers. After removing the portions of the sacrificial layers in the channel regions of the first and second composite fins, the nanowire channels 233, 243 are suspended between a pair of source/drain features.

After the operation 29, the method 20 may include other operations or acts according to some embodiments of the present disclosure. In some embodiments, the remained first fin 212 and the remained second fin 222 (labeled in FIG. 28B) may be removed after the operation 29, as shown in FIGS. 29A-29B, in which FIG. 29B shows the cross section along the line B-B' of FIG. 29A. In FIG. 29B, void regions 247 indicate where the remained first fin 212 and the remained second fin 222 are removed.

Figure 30A:
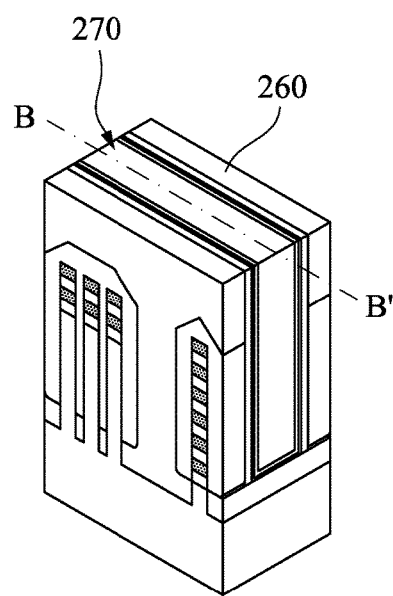
Figure 30B:
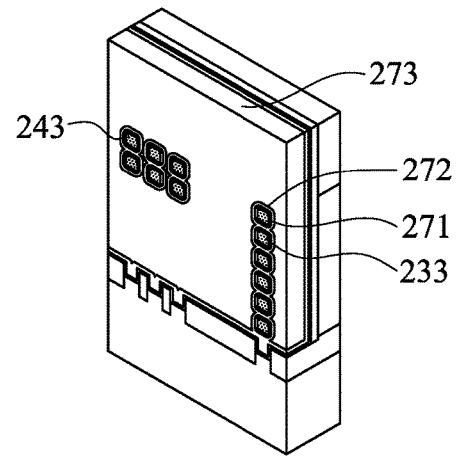

Referring to FIGS. 30A-30B, the method 20 may further include an operation of forming a metal gate 270 wrapping the nanowire channels 233, 243, in which FIG. 30B shows cross section along the line B-B' of FIG. 30A. In some embodiment, the metal gate formation includes depositing an interfacial layer 271, a high-k dielectric layer 272, and a metal gate material 273, and thereafter performing a CMP process to remove the materials over the dielectric layer 260. Although FIGS. 30A-30B depict six nanowire channels 233 and six nanowire channels 243, one skilled in the art would appreciate that the number of the nanowire channels 233, 243 may be changed, and these shown in FIGS. 30A-30B are merely an example. Accordingly, a semiconductor structure including HGAA transistors with different number of nanowire channels may be obtained. In yet some embodiments, some of the nanowire channels 243 may be remover in a suitable process prior to the operation of forming the metal gate 270, but after the operation 22 shown in FIG. 18. For example, some of the second composite fins 240 may be etched away after the operation 23 but prior to the operation 24. In specifics, referring to FIGS. 22-23, a mask (not shown) may be formed covering the first composite fin 230 and only one of the second composite fins 240 shown in FIG. 22B, and then an etching process is carried out to remove the uncovered second composite fins 240, thus leaving only one second composite fin 240 on the substrate. Therefore, in the subsequent operations, there is only one second composite fin 240 present, and results in only two nanowire channels 243 being present in FIG. 30B.

Advantages of various embodiments of the present disclosure include providing a novel method for manufacturing a semiconductor structure including HGAA devices with different number of nanowire channels. Significantly, the HGAA devices with different number of nanowire channels may be formed concurrently.

In accordance with one aspect of some embodiments, a method includes the following operations: (i) receiving a FET precursor including a first fin and a second fin, in which the first fin includes a first base-fin and a first number of first composite layers on the first base-fin, the second fin includes a second base-fin and a second number of second composite layers on the second base-fin, and each of the first and second composite layers includes a sacrificial layer and a nanowire channel stacked thereon, and the first number is different from the second number; (ii) forming a dummy gate traversing the first and second fins, thereby defining channel regions of the first and second fins under the dummy gate; (iii) forming source/drain features from exposed portions of the first and second fins; (iv) removing the dummy gate to expose the channel regions of the first and second fins; and (v) suspending the nanowire channels of the first and second fins by removing portions of the sacrificial layers of the first and second fins in the channel regions.

In accordance with another aspect of some embodiments, a method includes the following operations: (i) receiving a precursor substrate, the precursor substrate including an isolation structure, and a first fin and a second fin embedded in the isolation structure; (ii) recessing the first and second fins to respectively form a first recess and a second recess in the isolation structure, the first recess having a depth different from a depth of the second recess; (iii) forming a first composite fin and a second composite fin respectively in the first and second recesses, in which the first composite fin includes a first number of first composite layers, the second composite fin includes a second number of second composite layers, each of the first and second composite layers includes a sacrificial layer and a nanowire channel stacked thereon, the first number being different from the second number; (iv) recessing the isolation structure to expose sides of the first and second composite fins; (v) forming a dummy gate traversing the first and second composite fins, thereby defining channel regions of the first and second composite fins under the dummy gate; (vi) forming source/drain features from exposed portions of the first and second composite fins; (vii) forming a dielectric layer covering the source/drain features; (viii) removing dummy gate to expose the channel regions of the first and second composite fins; and (ix) removing portions of the sacrificial layers of the first and second composite fins in the channel regions.

In accordance with another aspect of some embodiments, a method includes the following operations: (i) receiving a precursor substrate, the precursor substrate including a first fin, a plurality of second fins, and an isolation structure, the first and second fins being embedded in the isolation structure, wherein the second fins are adjacent to each other; (ii) recessing the first and second fins to respectively form a first recess and a plurality of second recesses, wherein the first recess has a depth greater than a depth of each second recess; (iii) forming a first composite fin and a plurality of second composite fins respectively in the first recess and the second recesses, wherein the first composite fin includes a first number of first composite layers, the second composite fin includes a second number of second composite layers, each of the first and second composite layers includes a sacrificial layer and a nanowire channel stacked thereon, the first number being greater than the second number; (iv) recessing the isolation structure to expose sides of the first and second composite fins; (v) forming a dummy gate traversing the first and second composite fins, thereby defining channel regions of the first and second composite fins under the dummy gate; (vi) forming source/drain features from exposed portions of the first and second composite fins; (vii) forming a dielectric layer covering the source/drain features; (viii) removing dummy gate to expose the channel regions of the first and second composite fins; and (ix) removing portions of the sacrificial layers of the first and second composite fins in the channel regions.

What is claimed is:

1. A method, comprising:

receiving a precursor substrate, the precursor substrate comprising a first fin, a plurality of second fins, and an isolation structure, the first and second fins being embedded in the isolation structure, wherein the second fins are adjacent to each other;

recessing the first and second fins to respectively form a first recess and a plurality of second recesses, wherein the first and second fins are concurrently etched and the second fins are configured to cause a loading effect on the etching such that a depth of each second recess is less than a depth of the first recess;

forming a first composite fin and a plurality of second composite fins respectively in the first recess and the second recesses, wherein the first composite fin comprises a first number of first composite layers, the second composite fin comprises a second number of second composite layers, each of the first and second composite layers comprises a sacrificial layer and a nanowire channel stacked thereon, and the first number is greater than the second number;

recessing the isolation structure to expose sides of the first and second composite fins;

forming a dummy gate traversing the first and second composite fins, thereby defining channel regions of the first and second composite fins under the dummy gate;

forming source/drain features from exposed portions of the first and second composite fins;

forming a dielectric layer covering the source/drain features;

removing dummy gate to expose the channel regions of the first and second composite fins;

removing portions of the sacrificial layers of the first and second composite fins in the channel regions.

2. The method according to claim 1, wherein forming the first composite fin and the second composite fin comprises:

alternately epitaxially growing a plurality of $Si_xGe_{(1-x)}$ layers and a plurality of $Si_yGe_{(1-y)}$ layers from the recessed first and second fins in the first and second recesses, wherein x and y are numbers between 0 and 1, and x is different from y; and applying chemical-mechanical polishing process to remove excess portions of the $Si_xGe_{(1-x)}$ layers and $Si_yGe_{(1-y)}$ layers on the isolation structure.

3. The method according to claim 1, further comprising removing a recessed first fin and recessed second fins, after removing the portions of the sacrificial layers of the first and second composite fins in the channel regions.

4. The method according to claim 3, further comprising forming a metal gate wrapping the nanowire channels after removing the recessed first fin and the recessed second fins.

* * * * *